(12) United States Patent
Butler et al.

(10) Patent No.: US 7,675,201 B2
(45) Date of Patent: Mar. 9, 2010

(54) LITHOGRAPHIC APPARATUS WITH PLANAR MOTOR DRIVEN SUPPORT

(75) Inventors: Hans Butler, Best (NL); Franciscus Adrianus Gerardus Klaassen, Best (NL)

(73) Assignee: ASML Netherlands B.V., Veldhoven (NL)

( * ) Notice: Subject to any disclaimer, the term of this patent is extended or adjusted under 35 U.S.C. 154(b) by 624 days.

(21) Appl. No.: 11/492,215

(22) Filed: Jul. 25, 2006

(65) Prior Publication Data

US 2008/0024741 A1    Jan. 31, 2008

(51) Int. Cl.
*H02K 44/00*    (2006.01)
*G03B 27/00*    (2006.01)

(52) U.S. Cl. .......................................... 310/12; 355/18
(58) Field of Classification Search ................. 254/389; 310/12, 13, 53, 72; 355/18
See application file for complete search history.

(56) References Cited

U.S. PATENT DOCUMENTS

| | | | |
|---|---|---|---|
| 6,144,119 | A | 11/2000 | Hazelton |
| 6,222,614 | B1 | 4/2001 | Ohtomo |
| 6,891,599 | B2 | 5/2005 | Iwamoto |
| 6,989,887 | B2* | 1/2006 | Poon et al. ..................... 355/72 |
| 7,034,920 | B2* | 4/2006 | Kwan et al. .................... 355/53 |
| 2003/0155821 | A1 | 8/2003 | Frissen et al. |
| 2003/0173556 | A1* | 9/2003 | Watson ........................ 254/389 |
| 2005/0128449 | A1* | 6/2005 | Phillips ........................ 355/53 |
| 2005/0218842 | A1* | 10/2005 | Yang et al. ................... 318/114 |
| 2005/0255624 | A1 | 11/2005 | Miyajima |
| 2006/0232140 | A1* | 10/2006 | Binnard ........................ 310/10 |
| 2007/0164697 | A1* | 7/2007 | Cox et al. ..................... 318/701 |

FOREIGN PATENT DOCUMENTS

| | | |
|---|---|---|
| EP | 1347337 A2 | 9/2003 |
| EP | 1372039 A2 | 12/2003 |
| EP | 1347337 A3 | 8/2005 |
| EP | 1372039 A3 | 8/2006 |

OTHER PUBLICATIONS

English Translation of Chinese Official Action issued on Nov. 14, 2008 in Chinese Application No. 200710136721.5.

* cited by examiner

*Primary Examiner*—Quyen Leung
*Assistant Examiner*—Jose A Gonzalez Quinones
(74) *Attorney, Agent, or Firm*—Pillsbury Winthrop Shaw Pittman LLP

(57) ABSTRACT

A lithographic apparatus includes an illumination system that conditions a radiation beam, a patterning support holding a patterning device that patterns the radiation beam, a substrate support to hold a substrate, a projection system to project the patterned radiation beam onto the substrate, an additional support, and a flexible line assembly to transfer at least one of a current, a signal or a fluid. A first part of the line assembly extends between a base and the additional support, and a second part extends between the additional support and the patterning support or the substrate support. A first motor assembly generates a force in at least one direction, and is coupled to the one of either the patterning support or the substrate support. A second motor assembly generates a force in the at least one direction, and is coupled to the additional support. The first motor assembly includes a planar motor.

21 Claims, 8 Drawing Sheets

LITHOGRAPHIC APPARATUS WITH PLANAR MOTOR DRIVEN SUPPORT

BACKGROUND

1. Field of the Invention

The present invention relates to a lithographic apparatus with a planar motor driven support.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The patterning device is supported by, or held to, a patterning support being movable with six degrees of freedom (DOF) by a patterning drive arrangement. The substrate is supported by, or held to, a substrate support being movable with six DOF by a substrate drive arrangement. The driven patterning support and the driven substrate support are conventionally referred to as stages, where the patterning support may also be referred to as reticle stage, and the substrate support may also be referred to as wafer stage. The lithographic apparatus may include still other supports containing a drive arrangement, and these supports may likewise be referred to as stages.

It is desirable to very accurately position the stages in a lithographic apparatus to be able to obtain substrates having the required patterned structures, which may be very fine, during operation of the lithographic apparatus.

Conventionally, a drive arrangement of a stage from a long-stroke module and a short-stroke module is composed. The drive arrangement for the short-stroke module provides a positioning of the stage support relative to the long-stroke module. The drive arrangement for the long-stroke module provides a positioning of the long-stroke module relative to a frame or base. Therefore, in a positioning of a stage including a long-stroke module and a short-stroke module, the drive arrangement for the long-stroke module generates forces to move both the long-stroke module and the short-stroke module, whereas the drive arrangement for the short-stroke module generates forces to move only the short-stroke module (relative to the long-stroke module). Thus, forces needed to move the short-stroke module are generated twice, both by the long-stroke module and by the short-stroke module, which leads to a high energy consumption of the long-stroke module drive arrangement, and may cause heating problems, as well as limitations to accuracy and performance of the lithographic apparatus.

U.S. Pat. No. 6,891,599 discloses an embodiment of a stage apparatus including a main stage (such as a reticle stage) and a sub-stage, where cables and tubes, such as current supply cables, communication/sensor cables and cooling fluid tubes, leading from a frame or base to the main stage, are partly mounted between the base and the sub-stage, and partly mounted between the sub-stage and the main stage. A motor is provided between the sub-stage and the main stage for a short stroke positioning, and controlled such that the distance between the sub-stage and the main stage will change only in the range of several tens of micrometers. Disturbances caused by the cables and tubes between the base and the sub-stage during movement of the stage apparatus thus need not cause disturbances affecting the main stage. The main stage and the sub-stage are driven by linear motors with a long stroke in an Y direction, and a short stroke in an X direction.

SUMMARY

It is desirable to provide a simplified, more versatile stage apparatus having a high accuracy.

In an embodiment, the present invention provides a lithographic apparatus including: an illumination system configured to condition a radiation beam; a patterning support constructed to hold a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate; an additional support; a flexible line assembly configured to transfer at least one of a current, a signal and a fluid, the line assembly having a first part extending between a base and the additional support, and having a second part extending between the additional support and one of the patterning support and the substrate support; a first motor assembly configured to generate a force in at least one direction, the first motor assembly being coupled to the one of the patterning support and the substrate support; and a second motor assembly configured to generate a force in the at least one direction, the second motor assembly being coupled to the additional support, wherein the first motor assembly includes a planar motor.

In an embodiment, the present invention provides a lithographic apparatus including: an illumination system configured to condition a radiation beam; a patterning support constructed to hold a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate; an additional support; a flexible line assembly configured to transfer at least one of a current, a signal and a fluid, the line assembly having a first part extending between a base and the additional support, and having a second part extending between the additional support and one of the patterning support and the substrate support; a first motor assembly configured to generate a force in at least one direction, the first motor assembly being coupled to the one of the patterning support and the substrate support; and a second motor assembly configured to generate a force in the at least one direction, the second motor assembly being coupled to the additional support; wherein the first motor assembly includes a planar motor, and wherein the one of the patterning support and the substrate support has a first side, the additional support having a second side extending at least partially along the first side at a distance thereto, the apparatus further including a plurality of actuators situated along the first and second sides, and each actuator configured to generate a force between the additional support and the one of the patterning support and the substrate support.

In an embodiment, the invention provides a lithographic apparatus including: an illumination system configured to condition a radiation beam; a patterning support constructed to hold a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate; an additional support; a flexible line assembly configured to transfer at least one of a current, a signal and a fluid, the line assembly having a first part extending between a frame and the additional support, and having a second part extending between the additional support and one of the patterning support and the substrate support; a first motor assembly configured to generate a force in at least one direction, the first motor assembly being coupled to the one of the patterning support and the substrate support; a second motor assembly configured to generate a force in the at least one direction, the second motor assembly being coupled to the additional support; and a plurality of actuators each configured to generate a force between the additional support and the one of the patterning support and the substrate support, wherein the first motor assembly includes a planar motor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
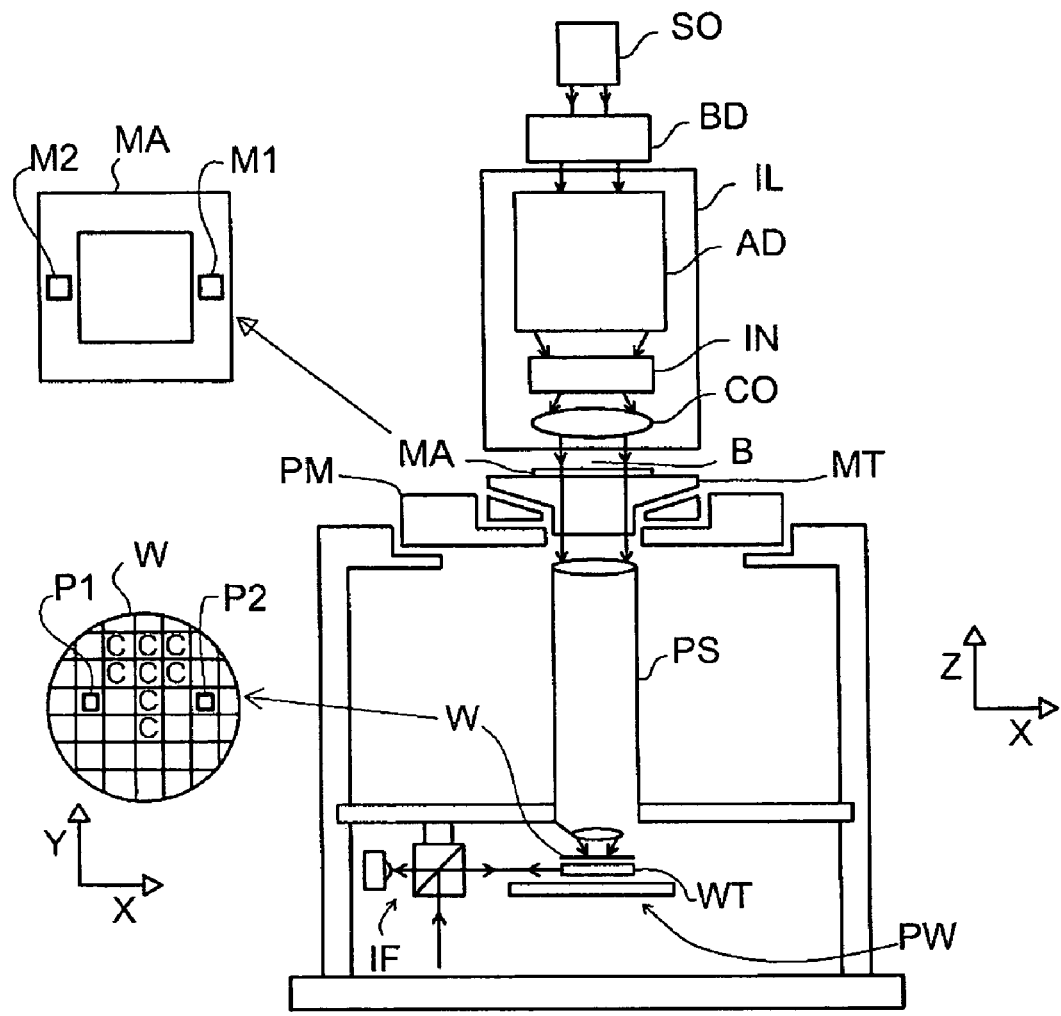
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan.

According to an embodiment of the present invention, a movement of the mask table MT may be realized with the aid of a planar motor, which forms part of the first positioning device PM. Similarly, according to an embodiment of the present invention, a movement of the substrate table WT or "substrate support" may be realized using a planar motor, which form part of the second positioning device PW. If one of the first positioning device PM and second positioning device PW includes a planar motor, the other one of the positioning devices PM and PW may include a non-planar motor, wherein e.g. a movement of the mask table MT may be realized with the aid of a long-stroke module (coarse positioning) and a short-stroke module (fine positioning), or a movement of the substrate table WT or "substrate support" may be realized using a long-stroke module and a short-stroke module. As an example, in FIG. 1 the first positioning device PM symbolically has been depicted including a non-planar motor, whereas the second positioning device PW symbolically has been depicted including a planar motor. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
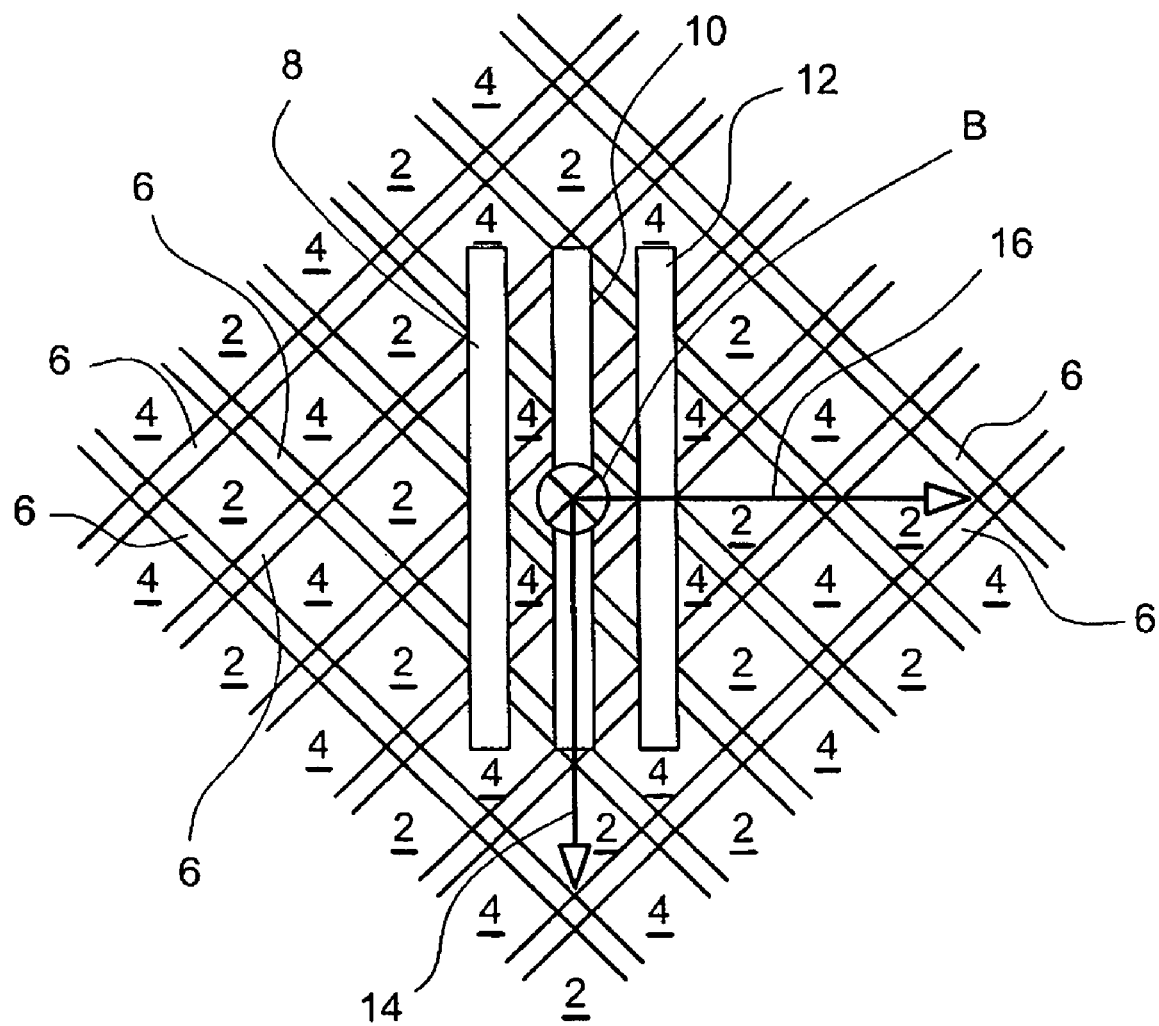
FIG. 2 depicts a diagram, in top view, for illustration of a construction and operation of a planar motor.

FIG. 2 diagrammatically shows a configuration of components of an embodiment of a planar motor for the purpose of briefly reiterating a basic construction and operation. A stator includes an assembly of permanent magnets, and a mover includes an assembly of electrical coils, where for each coil only a part is shown as current conductors. The permanent magnets are arranged in a checkerboard pattern, and include first magnets 2 being polarized at right angles to the plane of the drawing in a first direction, second magnets 4 being polarized at rights angles to the plane of the drawing in a second direction opposite to the first direction, and optionally third (Halbach) magnets 6 being essentially polarized at right angles to the first and second directions for enhancing the magnetic field pattern created by the first magnets 2 and the second magnets 4. Thus a permanent magnet pattern (array) of rows and columns is formed. Each row and column contains a sequence of a first, third, second, third, first, third, second, third, etc., magnet. The first magnets 2, second magnets 4 and third magnets 6 are provided on a support (not shown). Current conductors 8, 10 and 12, which may each form part of a different coil, extend at an angle different from 0 degrees (e.g. between approximately 30-60 degrees, in particular 45 degrees as shown in FIG. 2) relative to a row or column direction, and are situated in the effective magnetic field of the first, second and third magnets.

When the current conductors 8, 10 or 12 carry a current in a direction of arrow 14 shown in FIG. 2, and a direction of the magnetic field B generated by the first, second and third magnets at the indicated location is at right angles to the arrow 14, an electromagnetic force will be exerted on the current conductor 8, 10 or 12 in the direction of arrow 16. Thus, a mover coupled to the current conductors 8, 10 and 12 may be moved across the array of first, second and third magnets by a suitable choice of currents in the current conductors.

It is noted that in practice often a three-phase current system is used, where a set of three coils (or a plurality of three coils) carrying currents being phase-shifted at 120 degrees relative to each other is applied. Also, to obtain sufficient degrees of freedom for a movement of the mover relative to the stator, the mover includes different sets of coils with current conductors extending in different directions. A bearing between the mover and the stator is a magnetic bearing.

Figure 3:
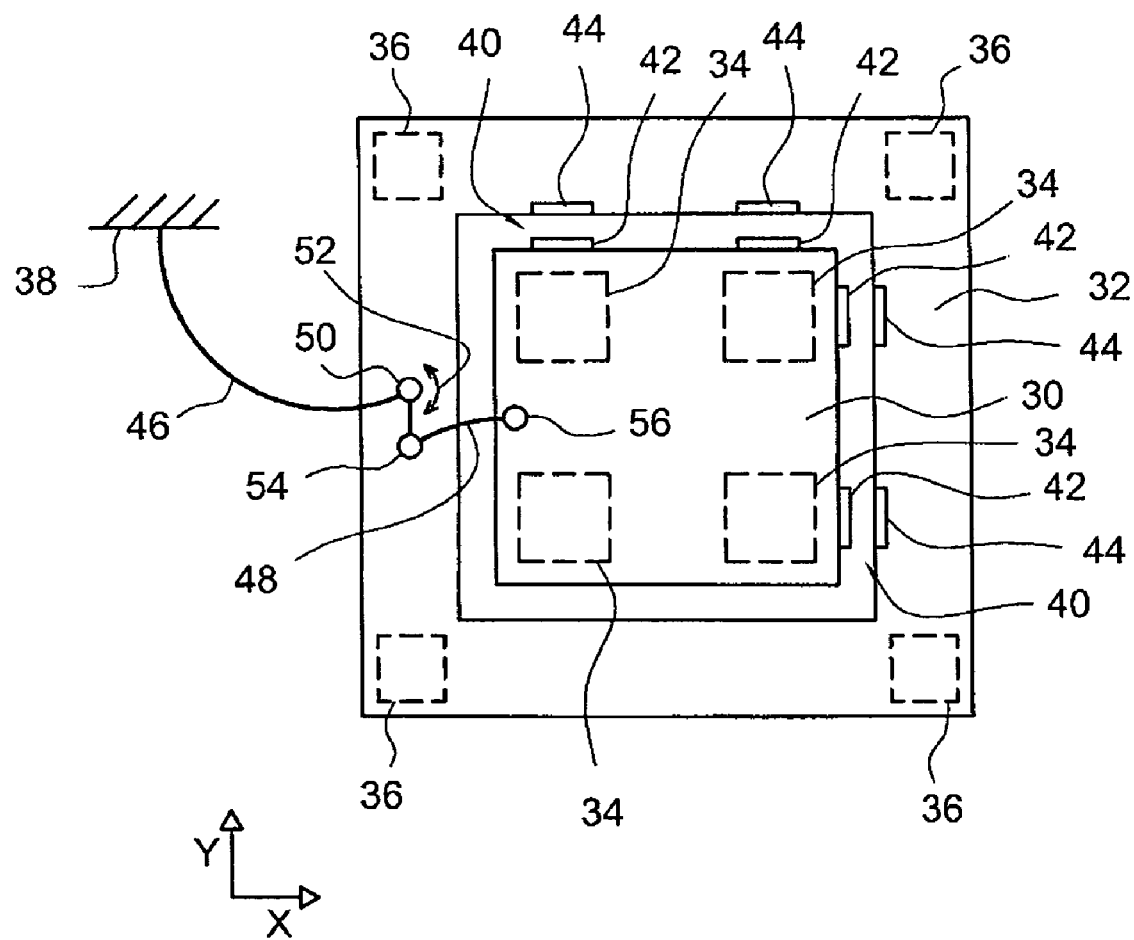
FIG. 3 depicts a top view of a stage of a lithographic apparatus according to an embodiment of the invention.

FIG. 3 schematically shows a planar motor mover of a stage according to an embodiment of the present invention. The mover includes a main mover 30 and an additional mover 32 which may have a common stator (not shown). The main mover 30 and the stator are part of a first motor assembly, and the additional mover and the stator are part of a second motor assembly. The main mover 30 has an essentially rectangular shape, and may include a number of (e.g. four as shown) sets of coils 34. The additional mover 32 has an essentially rectangular frame shape, extends along the circumference of the main mover 30, and may include a number of (e.g. four as shown) sets of coils 36. The main mover 30 and the additional mover 32 extend in a same plane substantially parallel to a plane of the stator (not shown). The main mover 30 may be coupled to, or integral with, a substrate support or a patterning support, or another support, to position the support to enable a processing of a device (such as a patterning device or a substrate) held on the support. The additional mover 32 may be coupled to, or integral with, an additional support. Both the main mover 30 and the additional mover 32 are so-called "long-stroke" movers, as they move over a long distance with respect to the stator.

A number of (e.g. three, or four as shown) actuators 40 each having a first part 42 and a second part 44 are provided between sides of the main mover 30 and sides of the additional mover 32, in other words: acting between sides of the substrate support or patterning support on the one hand, and sides of the additional support on the other hand, and situated along the sides. Between the first part 42 and the second part 44 of each actuator 40 a force may be generated in a desired direction. The actuator may be of the so-called "voice-coil" type (coil and ferromagnetic core, polarized by permanent magnet(s), movable relative to each other) or of the "Lorentz" type (air coil movable in magnetic field generated by permanent magnet(s)).

From a base 38 (which may be a frame or a support, either stationary or movable) of the lithographic apparatus, one or more flexible lines 46 extend to the additional mover 32 or a support coupled thereto. From the additional mover 32, one or more flexible lines 48 extend to the main mover 30 or a support coupled thereto. Through the at least one flexible line 46 electrical energy for the sets of coils 34 and 36 may be provided, as well as power and signals (e.g. electrical or optical) for performing measurements, a cooling fluid, etc., for the additional mover 32 and the main mover 30. Through the at least one flexible line 48 electrical energy for the sets of coils 34 may be provided, as well as power and signals (e.g. electrical or optical) for performing measurements, a cooling fluid, etc., for the main mover 30. The at least one flexible line 46 is coupled to the additional mover 32 by coupling 50, which may be rigid or may be flexible, e.g. allowing a rotation in the directions of double arrow 52 and/or at right angles thereto. The at least one flexible line 48 is coupled to the additional mover 32 and the main mover 30 by couplings 54 and 56, respectively. Each of the couplings 54 and 56, or both, may be rigid or may be flexible like the coupling 50.

In operation, the main mover 30 in principle may be moved relative to the stator in the plane of the drawing by energizing its sets of coils 34, independently from a movement of the additional mover 32 relative to the stator by energizing its sets of coils 36. However, to avoid a mechanical interference between the main mover 30 and the additional mover 32, the additional mover 32 is controlled such that its movement follows the movement of the main mover 30. The actuators 40 allow for a correction of a position of the main mover 30 and the additional mover 32 relative to each other. The flexibility of the at least one flexible line 46, and a possible flexibility of the coupling 50 allow the additional mover 32 to move freely in a plane determined by the associated stator, thereby following the movement of the main mover 30. The flexibility of the at least one flexible line 48, and a possible flexibility of any of the couplings 54, 56 allow the main mover 30 and the additional mover 32 to move relative to each other.

In a lithographic apparatus, using planar motors provide for a simplification of stage construction and control. The orientation and distances of the additional mover 32 relative to the main mover 30 are kept as constant as possible. As a result, any disturbances caused by the at least one line 46 affect the additional mover 32, and essentially do no affect the mover 30. Both the additional mover 32 and the actuators 40 may have limited power, and can be made small. The additional mover 32 basically only has to generate forces to move the at least one line 46 and its own mass, and the actuators 40 only have to generate correction forces.

The main mover 30 carries a substrate or a mask, and hence it is desirable that its movement accuracy be high. Acceleration forces are generated by sets of coils 34. Sets of coils 34, however, may not provide sufficient movement accuracy because of their construction, which has to enable a large movement range. For this reason, actuators 40 are used to provide the required accuracy by applying correction forces on the main mover 30 during a movement. Since the actuators 40 do not need to provide acceleration forces, they can be made small and lightweight, and they do not dissipate much power. Reaction forces of actuators 40 are exerted on the additional mover 32. Since the correction forces are small, such reaction forces do not induce large displacements of the mover 30 with respect to the additional mover 32. Typically, if the main mover 30 and the additional mover 32 have a comparable mass, correction forces by actuators 40 induce displacements of the additional mover 32 of less than about 1 µm.

In the following Figures, X and Y directions have been indicated with arrows.

Figure 4:
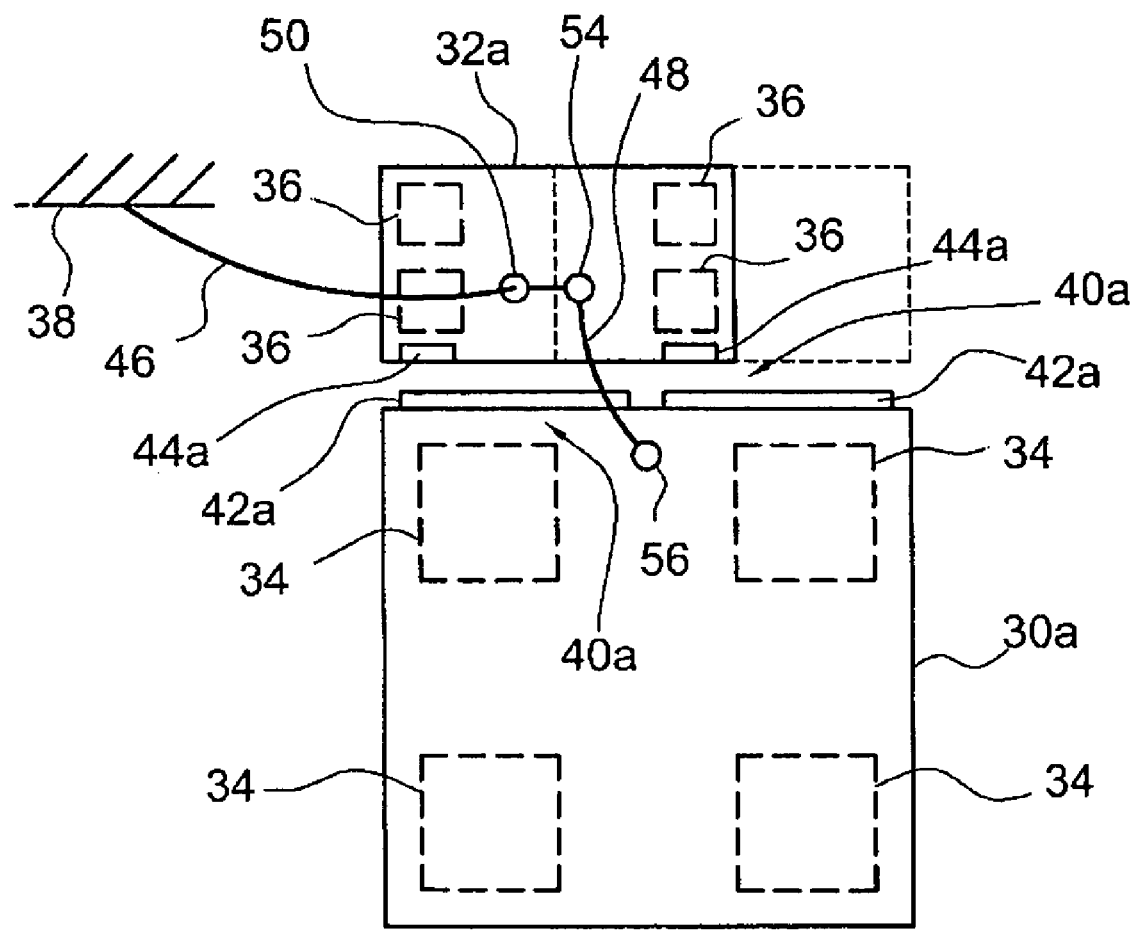
FIG. 4 depicts a top view of another stage of a lithographic apparatus according to an embodiment of the invention.

Referring to FIG. 4, a main mover 30a basically has a similar configuration as the main mover according to FIG. 3, including coil sets 34. An additional mover 32a having an essentially rectangular shape includes coil sets 36. At least one flexible line 46 is connected between base 38 and coupling 50, and at least one flexible line 48 is connected between coupling 54 and coupling 56. Actuators 40a each having a first part 42a and a second part 44a are provided between the main mover 30a and the additional mover 32a, the actuators 40a being situated along and acting between sides of supports coupled with, or integral with the main mover 30a and the additional mover 32a, respectively. The actuators 40a are effective and operational in any position of the additional mover 32a relative to the main mover 30a between the position shown in solid lines and the position shown in dashed lines.

In operation, the main mover 30a in principle may be moved relative to the stator in the plane of the drawing by energizing its sets of coils 34, independently from a movement of the additional mover 32a relative to the stator by energizing its sets of coils 36. However, to avoid a mechanical interference between the main mover 30a and the additional mover 32a, the additional mover 32a is controlled such that its movement follows the movement of the main mover 30a. The actuators 40a allow for a correction of a position of the main mover 30a and the additional mover 32a relative to each other, e.g. to accurately position the main mover 30a. The flexibility of the at least one flexible line 46, and a possible flexibility of the coupling 50 allow the additional mover 32a to move freely in a plane determined by the associated stator, thereby following the movement of the main mover 30a. The flexibility of the at least one flexible line 48, and a possible flexibility of any of the couplings 54, 56 allow the main mover 30a and the additional mover 32a to move relative to each other.

In a lithographic apparatus, the orientation and distances of the additional mover 32a relative to the main mover 30a are kept as constant as possible. The embodiment shown in FIG. 4 allows the additional mover 32a to move in an X direction relative to the main mover 30a between the position shown in solid lines and the position shown in dashed lines, thereby providing an extended operational flexibility of the mover as a whole, while keeping any disturbance forces on the main mover 30a low or negligible.

Figure 5:
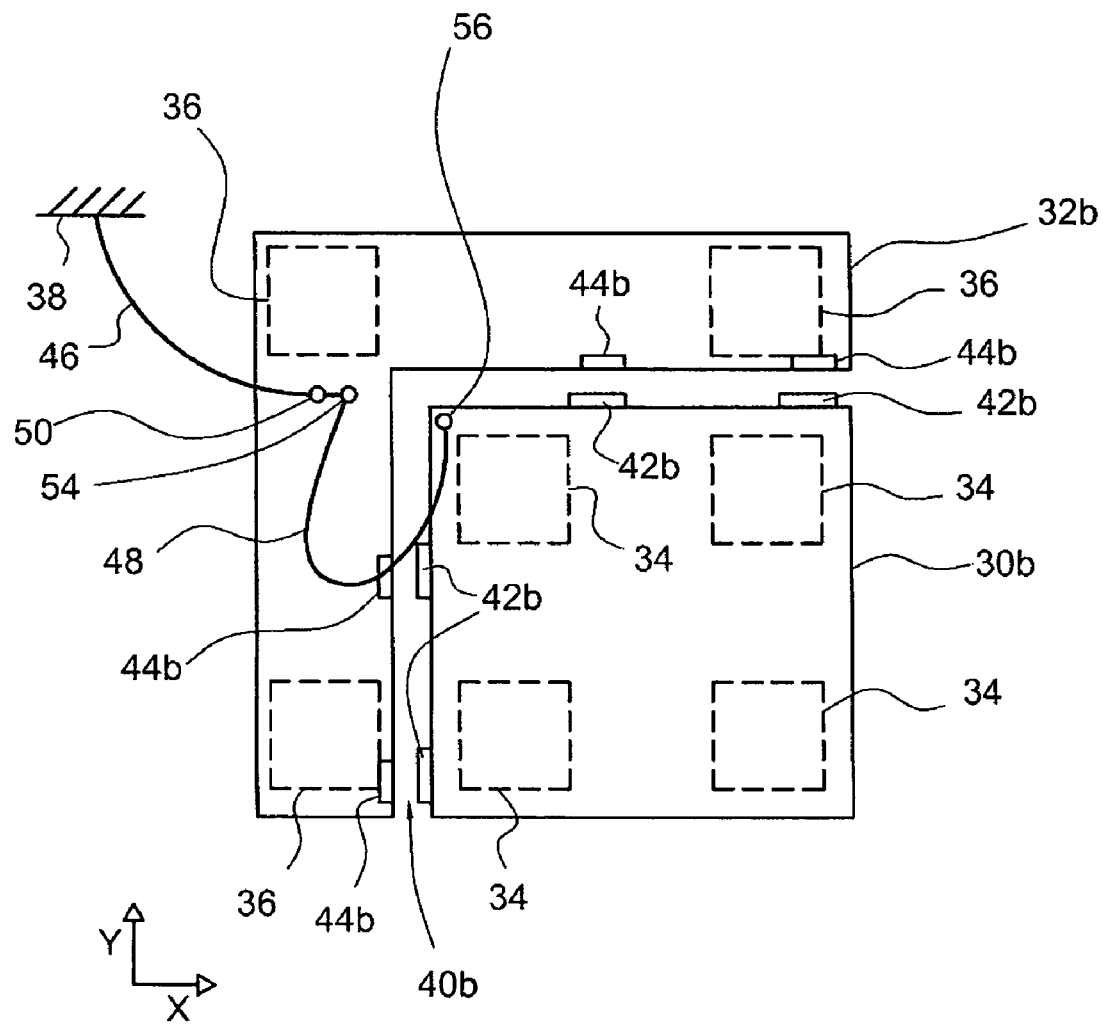
FIG. 5 depicts a top view of still another stage of a lithographic apparatus according to an embodiment of the invention.

Referring to FIG. 5, a main mover 30b basically has a similar configuration as the main mover according to FIG. 3, including coil sets 34. An additional mover 32b being essentially L-shaped includes coil sets 36. At least one flexible line 46 is connected between base 38 and coupling 50, and at least one flexible line 48 is connected between coupling 54 and coupling 56. Actuators 40b (e.g. three, or four as shown) each having a first part 42b and a second part 44b are provided between the main mover 30b and the additional mover 32b, the actuators 40b being situated along and acting between sides of supports coupled with, or integral with the main mover 30b and the additional mover 32b, respectively.

In operation, the main mover 30b in principle may be moved relative to the stator in the plane of the drawing by energizing its sets of coils 34, independently from a movement of the additional mover 32b relative to the stator by energizing its sets of coils 36. However, to avoid a mechanical interference between the main mover 30b and the additional mover 32b, the additional mover 32b is controlled such that its movement follows the movement of the main mover 30b. The actuators 40b allow for a correction of a position of the main mover 30b and the additional mover 32b relative to each other, e.g. to accurately position the main mover 30b. The flexibility of the at least one flexible line 46, and a possible flexibility of the coupling 50 allow the additional mover 32b to move freely in a plane determined by the associated stator, thereby following the movement of the main mover 30b. The flexibility of the at least one flexible line 48, and a possible flexibility of any of the couplings 54, 56 allow the main mover 30b and the additional mover 32b to move relative to each other.

In a lithographic apparatus, the orientation and distances of the additional mover 32b relative to the main mover 30b are kept as constant as possible, while keeping any disturbance forces on the main mover 30b low or negligible.

Figure 6:
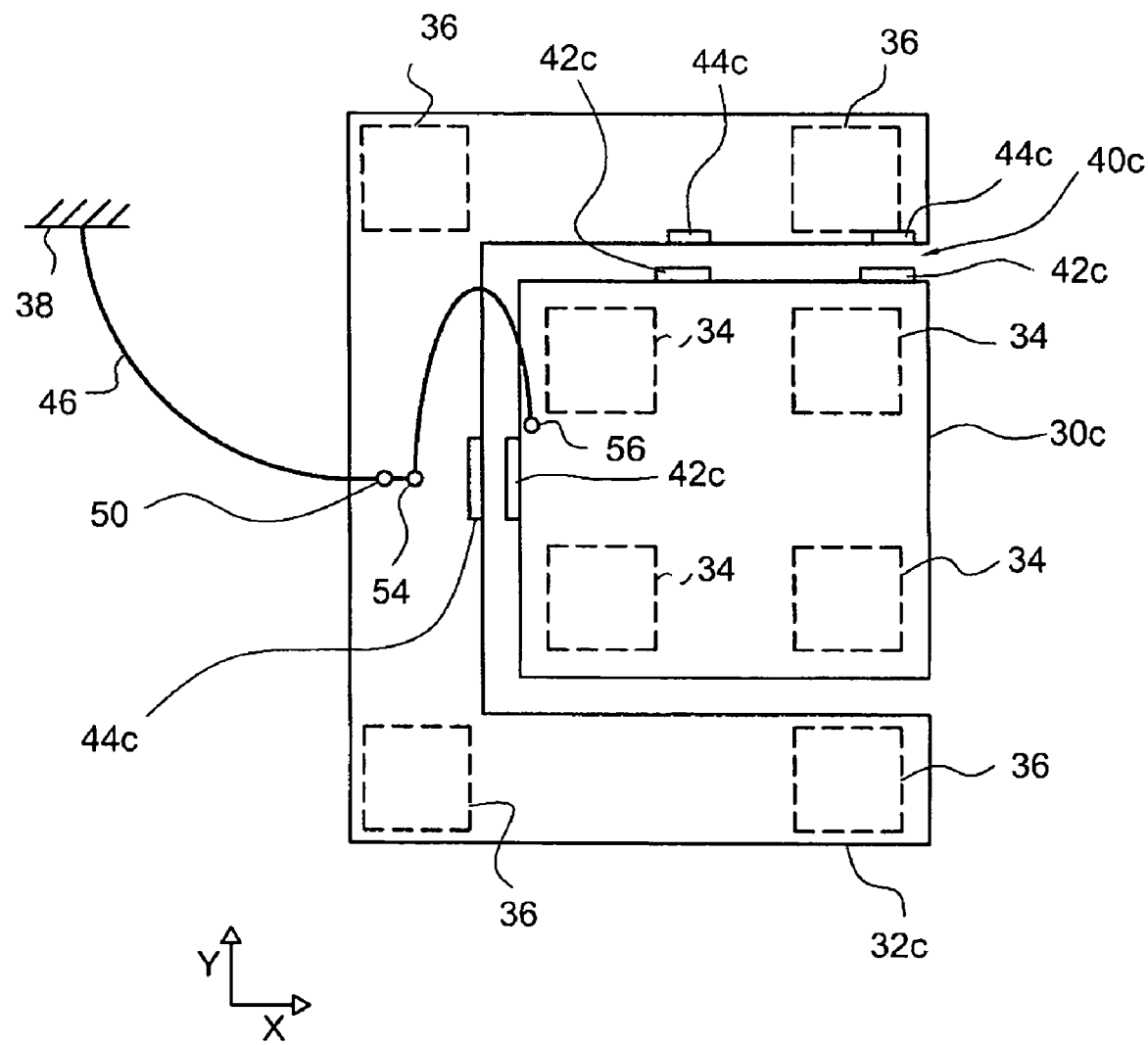
FIG. 6 depicts a top view of yet another stage of a lithographic apparatus according to an embodiment of the invention.

Referring to FIG. 6, a main mover 30c basically has a similar configuration as the main mover according to FIG. 3, including coil sets 34. An additional mover 32c being essentially U-shaped includes coil sets 36. At least one flexible line 46 is connected between base 38 and coupling 50, and at least one flexible line 48 is connected between coupling 54 and coupling 56. Actuators 40c (e.g. three as shown) each having a first part 42c and a second part 44c are provided between the main mover 30c and the additional mover 32c, the actuators 40c being situated along and acting between sides of supports coupled with, or integral with the main mover 30c and the additional mover 32c, respectively. The actuators 40c are effective and operational in any position of the additional mover 32c relative to the main mover 30c between the position shown in solid lines and the position shown in dashed lines.

In operation, the main mover 30c in principle may be moved relative to the stator in the plane of the drawing by energizing its sets of coils 34, independently from a movement of the additional mover 32c relative to the stator by energizing its sets of coils 36. However, to avoid a mechanical interference between the main mover 30c and the additional mover 32c, the additional mover 32c is controlled such that its movement follows the movement of the main mover 30c. The actuators 40c allow for a correction of a position of the main mover 30c and the additional mover 32c relative to each other, e.g. for accurately positioning the main mover 30c. The flexibility of the at least one flexible line 46, and a possible flexibility of the coupling 50 allow the additional mover 32c to move freely in a plane determined by the associated stator, thereby following the movement of the main mover 30c. The flexibility of the at least one flexible line 48, and a possible flexibility of any of the couplings 54, 56 allow the main mover 30c and the additional mover 32c to move relative to each other.

In a lithographic apparatus, the orientation and distances of the additional mover 32c relative to the main mover 30c are kept as constant as possible, while keeping any disturbance forces on the main mover 30c low or negligible.

Figure 7:
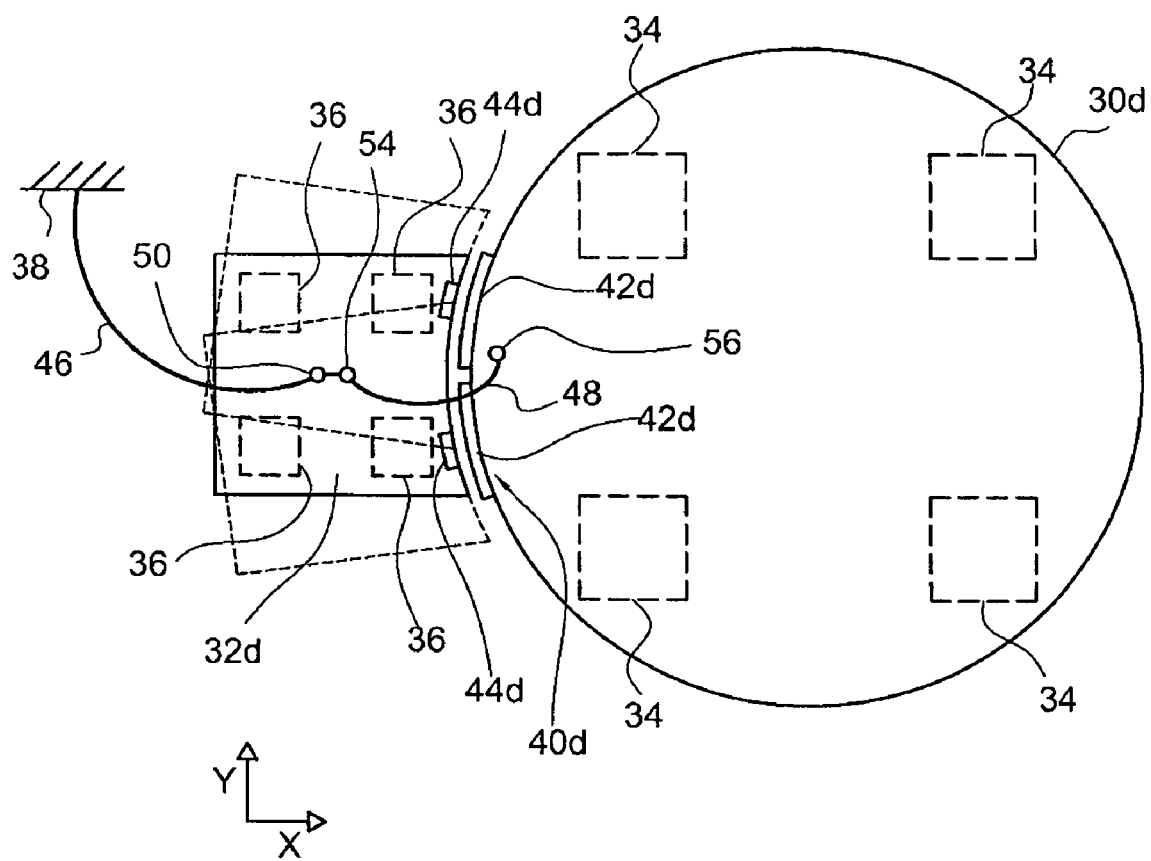
FIG. 7 depicts a top view of still another stage of a lithographic apparatus according to an embodiment of the invention.

Referring to FIG. 7, a main mover 30d having a circular shape includes coil sets 34. An additional mover 32d having an essentially quadrangular shape includes coil sets 36. At least one flexible line 46 is connected between base 38 and coupling 50, and at least one flexible line 48 is connected between coupling 54 and coupling 56. Actuators 40d each having a first part 42d and a second part 44d are provided between the main mover 30d and the additional mover 32d, the actuators 40d being situated along and acting between sides of supports coupled with, or integral with the main mover 30d and the additional mover 32d, respectively. The actuators 40d are effective and operational in any position of the additional mover 32d relative to the main mover 30d between the position shown in solid lines and the positions shown in dashed lines.

In operation, the main mover 30d in principle may be moved relative to the stator in the plane of the drawing by energizing its sets of coils 34, independently from a movement of the additional mover 32d relative to the stator by energizing its sets of coils 36. However, to avoid a mechanical interference between the main mover 30d and the additional mover 32d, the additional mover 32d is controlled such that its movement follows the movement of the main mover 30d. The actuators 40d allow for a correction of a position of the main mover 30d and the additional mover 32d relative to each other, e.g. for accurately positioning the main mover 30d. The flexibility of the at least one flexible line 46, and a possible flexibility of the coupling 50 allow the additional mover 32d to move freely in a plane determined by the associated stator, thereby following the movement of the main mover 30d. The flexibility of the at least one flexible line 48, and a possible flexibility of any of the couplings 54, 56 allows the main mover 30d and the additional mover 32d to move relative to each other.

In a lithographic apparatus, the orientation and distances of the additional mover 32d relative to the main mover 30d are kept as constant as possible. However, the embodiment shown in FIG. 7 allows the additional mover 32d to move relative to the main mover 30d between the position shown in solid lines and the position shown in dashed lines, thereby providing an extended operational flexibility of the mover as a whole, while keeping any disturbance forces on the main mover 30d low or negligible.

Figure 8:
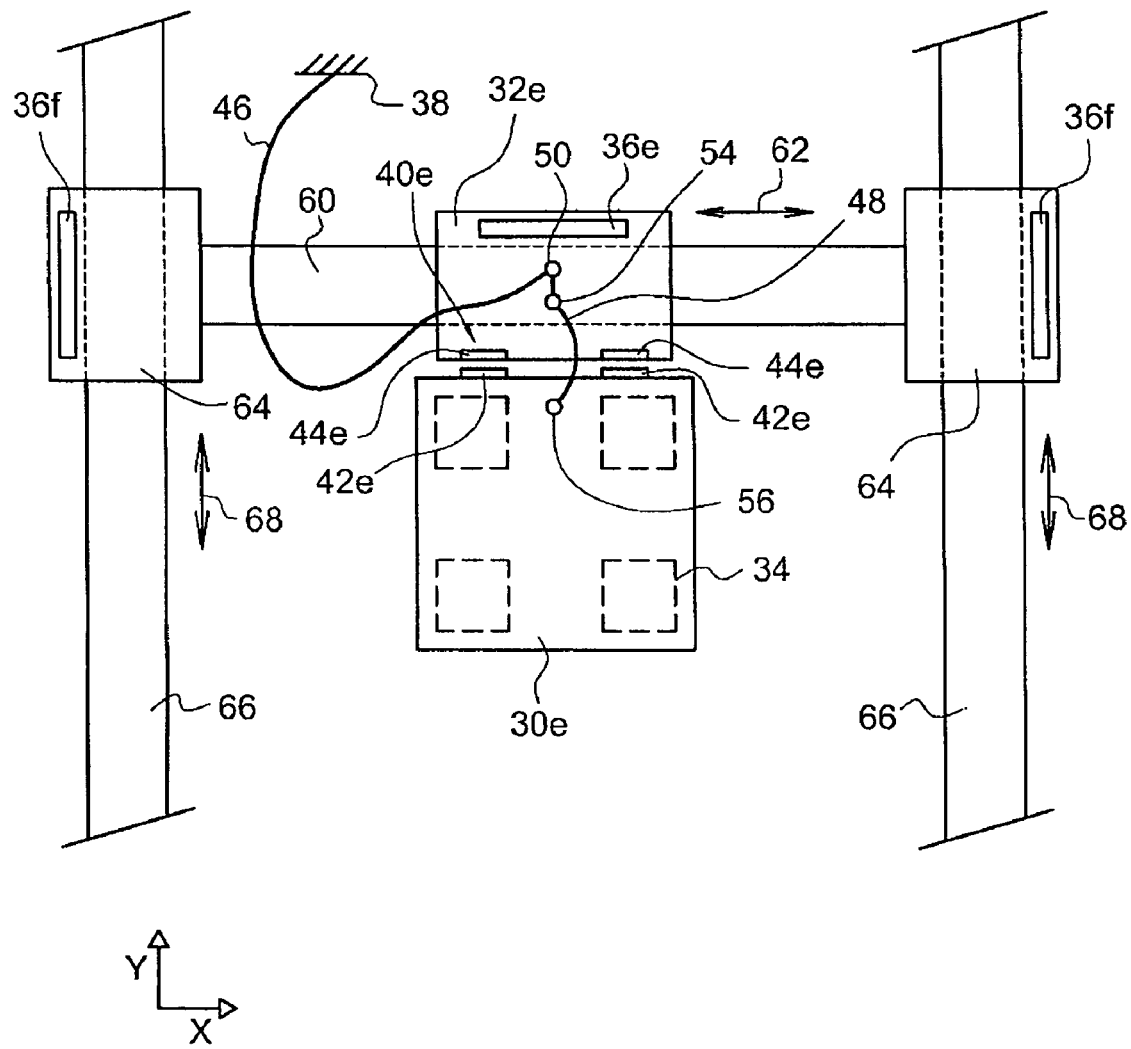
FIG. 8 depicts a top view of yet another stage of a lithographic apparatus according to an embodiment of the invention.

Referring to FIG. 8, a main mover 30e basically has a similar configuration as the main mover according to FIG. 3, including coil sets 34. An additional mover 32e is movable along a guide 60 in X directions indicated with double arrow 62 using a linear motor of which a mover is indicated with 36e, and of which a stator (not shown) is provided on the guide 60. The guide 60 is connected to movers 64 movable along guides 66 in Y directions indicated with double arrow 68 using linear motors of which movers are indicated with 36f, and of which stators (not shown) are provided on the guides 66. At least one flexible line 46 is connected between base 38 and coupling 50 on the additional mover 32e, and at least one flexible line 48 is connected between coupling 54 on the additional mover 32e and coupling 56 on the main mover 30e. Actuators 40e each having a first part 42e and a second part 44e are provided between the main mover 30e and the additional mover 32e, the actuators 40e being situated along and acting between sides of supports coupled with, or integral with the main mover 30e and the additional mover 32e, respectively.

In operation, the main mover 30e in principle may be moved relative to the stator in the plane of the drawing by energizing its sets of coils 34, independently from a movement of the additional mover 32e relative to the stator by the linear motors 36e and 36f. However, to avoid a mechanical interference between the main mover 30e and the additional mover 32e, the position of the additional mover 32e is controlled such that its movement follows the movement of the main mover 30e. The actuators 40e allow for a correction of a position of the main mover 30e and the additional mover 32e relative to each other, e.g. for accurately positioning the main mover 30e. The flexibility of the at least one flexible line 46, and a possible flexibility of the coupling 50 allow the additional mover 32e to move freely in a plane determined by the guides 60 and 66 being parallel to the stator, thereby following the movement of the main mover 30e. The flexibility of the at least one flexible line 48, and a possible flexibility of any of the couplings 54, 56 allow the main mover 30e and the additional mover 32e to move relative to each other.

In a lithographic apparatus of a twin or dual stage design, including two independently movable stages each containing a main mover/support and an associated additional mover/support according to the embodiments of FIGS. 4, 5, 6 or 8, which may have a common stator, the main movers/supports of the two stages can be positioned substantially against each other to be moved jointly, e.g. for a so-called chuckswap. As can be seen in FIG. 4, the main mover/support 30a provides three sides to position another main mover/support 30a against. As can be seen in FIG. 5, the main mover/support 30b provides two sides to position another main mover/support 30b against. As can be seen in FIG. 6, the main mover/support 30c provides one side to position another main mover/support 30c against. As can be seen in FIG. 8, the main mover/support 30e provides three sides to position another main mover/support 30e against.

It is noted that in some applications, the actuators as shown in the previous Figures may be dispensed with, or another number of actuators, such as four or three or two, depending on the embodiment shown, may be used.

It is further noted that in a planar motor as described above, instead of a mover containing coils and a stator containing permanent magnets, the mover may contain permanent magnets and the stator may contain coils. Examples of such alternative planar motor embodiments e.g. are disclosed in U.S. Pat. No. 6,144,119 and U.S. Patent Application No. 2005/255,624 which are incorporated by reference herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

As required, detailed embodiments of the present invention are disclosed herein. However, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language). The term coupled, as used herein, is defined as connected, although not necessarily directly, and not necessarily mechanically.

What is claimed is:

1. A lithographic apparatus comprising:
    a patterning device support constructed to hold a patterning device, the patterning device being capable of imparting a radiation beam with a pattern in its cross-section to form a patterned radiation beam;
    a substrate support constructed to hold a substrate;
    a projection system configured to project the patterned radiation beam onto a target portion of the substrate;
    an additional support;
    a flexible line assembly configured to transfer at least one of a current, a signal or a fluid, the line assembly having a first part extending between a base and the additional support, and having a second part extending between the additional support and one of either the patterning support or the substrate support;
    a first motor assembly configured to generate a force in at least one direction, the first motor assembly being coupled to said one of either the patterning support or the substrate support;
    a second motor assembly configured to generate a force in said at least one direction, the second motor assembly being coupled to the additional support;
    an actuator separate from the first and the second motor assembly, said actuator configured to provide an actuation force between a first side of the additional support and a second side of said one of either the patterning support or the substrate support, said first side extending at least partially along, and spaced apart from, said second side,
    wherein the first motor assembly comprises a planar motor, and
    wherein, in use, the first motor assembly and the second motor assembly are configured to move said one of either the patterning support or the substrate support and the additional support, respectively, over a same surface with said one of either the patterning support or the substrate support and said additional support spaced apart from each other.

2. The lithographic apparatus of claim 1, wherein the second motor assembly comprises a planar motor.

3. The lithographic apparatus of claim 1, wherein each of the first and the second motor assembly comprises a stator and a mover, and wherein one of the stator or the mover comprises a set of coils, and the other one of the stator or the mover comprises a set of permanent magnets.

4. The lithographic apparatus of claim 1, wherein the second motor assembly comprises:
    a first guide;
    a second guide extending substantially at right angles to the first guide;
    a first linear motor configured to move the second guide along the first guide; and
    a second linear motor configured to move the additional support along the second guide.

5. The lithographic apparatus of claim 1, wherein the second motor assembly comprises:
    a set of parallel guides;
    a transverse guide extending substantially at right angles to the set of parallel guides;
    a set of first linear motors configured to move the transverse guide along the set of parallel guides; and
    a second linear motor configured to move the additional support along the transverse guide.

6. The lithographic apparatus of claim 1, further comprising a plurality of actuators arranged along said first and second sides, and each of the plurality of actuators configured to generate a force between the additional support and said one of either the patterning support or the substrate support.

7. The lithographic apparatus of claim 1, wherein said one of the patterning support and the substrate support has a generally multilateral shape defining a plurality of first sides, said additional support having at least two second sides extending at least partially along at least two of said first sides at a distance thereto, the apparatus further comprising a plurality of actuators arranged along said at least two of said first and second sides, and each of the plurality of actuators configured to generate a force between the additional support and said one of either the patterning support or the substrate support.

8. The lithographic apparatus of claim 7, wherein said one of the patterning support and the substrate support has a generally rectangular shape defining four first sides.

9. The lithographic apparatus of claim 8, wherein said additional support has four second sides.

10. The lithographic apparatus of claim 1, wherein a coupling between a first part of the line assembly and the additional support is flexible.

11. The lithographic apparatus of claim 1, wherein a coupling between the second part of the line assembly and the additional support is flexible.

12. The lithographic apparatus of claim 1, wherein a coupling between the second part of the line assembly and said one of the patterning support and the substrate support is flexible.

13. A lithographic apparatus comprising:
    a patterning device support constructed to hold a patterning device, the patterning device being capable of imparting a radiation beam with a pattern in its cross-section to form a patterned radiation beam;
    a substrate support constructed to hold a substrate;
    a projection system configured to project the patterned radiation beam onto a target portion of the substrate;
    an additional support;
    a flexible line assembly configured to transfer at least one of a current, a signal or a fluid, the line assembly having a first part extending between a base and the additional support, and having a second part extending between the additional support and one of either the patterning support or the substrate support;

a first motor assembly configured to generate a force in at least one direction, the first motor assembly being coupled to said one of either the patterning support or the substrate support; and a second motor assembly configured to generate a force in said at least one direction, the second motor assembly being coupled to the additional support;

wherein the first motor assembly comprises a planar motor, and wherein said one of either the patterning support or the substrate support has a first side, said additional support having a second side extending at least partially along said first side at a distance thereto, the apparatus further comprising a plurality of actuators separate from the first and the second motor assembly and arranged along said first and second sides, and each actuator configured to generate a force between the additional support and said one of either the patterning support or the substrate support, and wherein, in use, the first motor assembly and the second motor assembly are configured to move said one of either the patterning support or the substrate support and the additional support, respectively, over a same surface with said one of either the patterning support or the substrate support and said additional support spaced apart from each other.

14. A lithographic apparatus comprising:

a patterning device support constructed to hold a patterning device, the patterning device being capable of imparting a radiation beam with a pattern in its cross-section to form a patterned radiation beam;

a substrate support constructed to hold a substrate;

a projection system configured to project the patterned radiation beam onto a target portion of the substrate;

an additional support;

a flexible line assembly configured to transfer at least one of a current, a signal or a fluid, the line assembly having a first part extending between a frame and the additional support, and having a second part extending between the additional support and one of either the patterning support or the substrate support;

a first motor assembly configured to generate a force in at least one direction, the first motor assembly being coupled to said one of either the patterning support or the substrate support;

a second motor assembly configured to generate a force in said at least one direction, the second motor assembly being coupled to the additional support; and a plurality of actuators separate from the first and the second motor assembly, each of the plurality of actuators configured to generate a force between the additional support and said one of either the patterning support or the substrate support, wherein the first motor assembly comprises a planar motor, and wherein, in use, the first motor assembly and the second motor assembly are configured to move said one of either the patterning support or the substrate support and the additional support, respectively, over a same surface with said one of either the patterning support or the substrate support and said additional support being spaced apart from each other.

15. A lithographic apparatus comprising:

a patterning device support constructed to hold a patterning device, the patterning device being capable of imparting a radiation beam with a pattern in its cross-section to form a patterned radiation beam;

a substrate support constructed to hold a substrate;

a projection system configured to project the patterned radiation beam onto a target portion of the substrate;

an additional support;

a flexible line assembly configured to transfer at least one of a current, a signal or a fluid, the line assembly having a first part extending between a base and the additional support, and having a second part extending between the additional support and one of either the patterning support or the substrate support;

a first motor assembly configured to generate a force in at least one direction, the first motor assembly being coupled to said one of either the patterning support or the substrate support;

a second motor assembly configured to generate a force in said at least one direction, the second motor assembly being coupled to the additional support, and an actuator separate from the first and the second motor assembly, said actuator configured to provide an actuation force between a first side of the additional support and a second side of said one of either the patterning support or the substrate support, said first side extending at least partially along, and spaced apart from, said second side, wherein, in use, the first motor assembly and the second motor assembly are configured to move said one of either the patterning support or the substrate support and the additional support, respectively, over a same surface with said one of either the patterning support or the substrate support and said additional support spaced apart from each other.

16. The lithographic apparatus of claim 15, wherein each of the first and the second motor assembly comprises a stator and a mover, and wherein one of the stator or the mover comprises a set of coils, and the other one of the stator or the mover comprises a set of permanent magnets.

17. The lithographic apparatus of claim 15, wherein the second motor assembly comprises:

a first guide;

a second guide extending substantially perpendicularly to the first guide;

a first linear motor configured to move the second guide along the first guide; and a second linear motor configured to move the additional support along the second guide.

18. The lithographic apparatus of claim 15, wherein the second motor assembly comprises:

a set of parallel guides;

a transverse guide extending substantially perpendicularly to the set of parallel guides;

a set of first linear motors configured to move the transverse guide along the set of parallel guides; and a second linear motor configured to move the additional support along the transverse guide.

19. The lithographic apparatus of claim 15, further comprising a plurality of actuators arranged along said first and second sides, and each of the plurality of actuators configured to generate a force between the additional support and said one of either the patterning support or the substrate support.

20. The lithographic apparatus of claim 15, wherein said one of the patterning support and the substrate support has a generally multilateral shape defining a plurality of first sides, said additional support having at least two second sides extending at least partially along at least two of said first sides at a distance thereto, the apparatus further comprising a plurality of actuators arranged along said at least two of said first and second sides, and each of the plurality of actuators configured to generate a force between the additional support and said one of either the patterning support or the substrate support.

21. The lithographic apparatus of claim 1, wherein the actuator includes a first part arranged on the first side of said one of either the patterning support or the substrate support and a second part arranged the second side of the additional support.

* * * * *